United States Patent
Marinero et al.

(10) Patent No.: US 7,112,375 B2
(45) Date of Patent: Sep. 26, 2006

(54) SEED LAYER STRUCTURE FOR IMPROVED CRYSTALLOGRAPHIC ORIENTATION OF A HARD MAGNETIC MATERIAL

(75) Inventors: Ernest E. Marinero, Saratoga, CA (US); Brian Rodrick York, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 310 days.

(21) Appl. No.: 10/765,645

(22) Filed: Jan. 26, 2004

(65) Prior Publication Data

US 2005/0164039 A1 Jul. 28, 2005

(51) Int. Cl.
*G11B 5/33* (2006.01)
(52) U.S. Cl. .................. 428/815; 428/815.2; 360/327.3
(58) Field of Classification Search ................ 428/815, 428/815.2; 360/327.3, 327.31, 324.11
See application file for complete search history.

(56) References Cited

U.S. PATENT DOCUMENTS

| | | | |
|---|---|---|---|
| 5,159,513 A | 10/1992 | Dieny et al. | |
| 5,206,590 A | 4/1993 | Dieny et al. | |
| 5,729,410 A | 3/1998 | Fontana, Jr. et al. | |
| 6,185,081 B1 * | 2/2001 | Simion et al. | 360/327.3 |
| 6,266,218 B1 | 7/2001 | Carey et al. | |
| 6,278,595 B1 | 8/2001 | Xue et al. | |
| 6,473,279 B1 | 10/2002 | Smith et al. | |
| 2003/0058586 A1 | 3/2003 | Pinarbasi et al. | |
| 2006/0051623 A1 * | 3/2006 | Wu et al. | 428/836.2 |

* cited by examiner

*Primary Examiner*—Holly Rickman
(74) *Attorney, Agent, or Firm*—Lumen IP Services; Thomas R. Berthold

(57) ABSTRACT

A seed layer structure for improved crystallographic orientation of grains in a hard magnetic material is disclosed. The seed layer structure is comprised of alternating layers of a metal and a dielectric. Hard magnetic materials deposited on the seed layer structure have superior properties and performance in providing hard bias to a ferromagnetic layer in a magnetic sensor. The seed layer structure also accommodates a relatively large total thickness, which is preferable in magnetic sensors with an ultra contiguous junction arrangement.

9 Claims, 13 Drawing Sheets

US 7,112,375 B2

SEED LAYER STRUCTURE FOR IMPROVED CRYSTALLOGRAPHIC ORIENTATION OF A HARD MAGNETIC MATERIAL

FIELD OF THE INVENTION

The present invention relates generally to a seed layer structure for improved crystallographic orientation in a hard magnetic material. More particularly, the present invention relates to a seed layer structure for providing an improved longitudinal bias magnetic field or hard bias for a sense layer in a magnetic sensor such as that in a magnetic read head used in magnetic recording.

BACKGROUND OF THE INVENTION

In a hard disk drive, a magnet write transducer or head is used to write and thus store information as magnetic bits on a spinning magnetic disk. The magnetic bits are regions on the magnetic disk with a net magnetization and having north and south poles where a magnetic field exits or enters the magnetic bits. During the writing of the magnetic bits, the magnetic write head is positioned in proximity of the spinning magnetic disk. More precisely, the magnetic write head is mounted on a slider that flies over the spinning magnetic disk on an airbearing. The slider is kept over an appropriate track of the magnetic disk by a servo control system. The magnetic bits, and thus the information, is read by positioning a magnetic read transducer or head in proximity above the spinning magnetic disk and over the appropriate track by the same slider and servo control system. The magnetic field associated with the magnetic bits outside of the magnetic disk (henceforth called the external magnetic field) enters the magnetic read head and affects a magnetic sensor in the magnetic read head such that a measurable output corresponding to the magnetic bits is produced. Magnetic sensors based on the fundamental principles of magnetoresistance including anisotropic magnetoresistance (AMR), giant magnetoresistance (GMR) or spin valve and spin tunneling have been well known in the art for some time. Magnetic read heads incorporating these magnetic sensors have also been produced and widely used. For examples, see U.S. Pat. Nos. 5,159,513 and 5,206,590.

The areal density of the magnetic disk corresponds to the number of magnetic bits per unit area. There is an ongoing demand for storing more information on a given disk and thus for increasing the areal density. Magnetic scaling is a well-known approach in the art for achieving higher areal density while maintaining the signal-to-noise ratio that is ultimately necessary to obtain the measurable output from the magnetic read head corresponding to the magnetic bits. For example, according to the magnetic scaling approach the dimensions associated with magnetic recording, such as the thickness of various layers in the magnetic read head, need to be reduced as the areal density is increased. As discussed below, however, not all the consequences of the magnetic scaling approach are fully appreciated in the art.

FIG. 1 shows an illustration of a prior art magnetic read head based on a typical GMR magnetic sensor as seen from the airbearing surface. The magnetic sensor has a high coercivity ferromagnetic pinned layer 112 (such as an alloy of NiFe) with a net magnetization whose direction pointing into the page is fixed and a low coercivity ferromagnetic free layer 116 (such as an alloy of NiFe) with a net magnetization whose direction is moveable, rotating from pointing into the page to pointing out of the page in response to the external magnetic field from the magnetic disk. The direction of the magnetization in the ferromagnetic pinned layer 112 is fixed by exchange coupling with an antiferromagnetic layer 110. For a current 113 in-plane (CIP) magnetic sensor such as that shown in FIG. 1, the ferromagnetic pinned layer 112 and the ferromagnetic free layer 116 are separated by a thin film of copper 114 or other non-magnetic metal with a relatively long electron mean free path. The variation in the resistance of the GMR magnetic sensor in response to the rotation of the direction of the magnetization in the ferromagnetic free layer 116 is known in the art. It is this variation that gives rise to the measurable output from the magnetic sensor in the magnetic read head corresponding to the magnetic bits written on the magnetic disk.

An important concern in the design of the magnetic sensor in FIG. 1 is a longitudinal bias magnetic field applied to the ferromagnetic free layer 116 by the high coercivity hard magnet 118 at the two side edges of the ferromagnetic free layer 116. Longitudinal direction is the direction in the plane of the airbearing surface and parallel to the layers of the magnetic sensor, i.e., from right to left in FIG. 1, as indicated by the arrow 120. The longitudinal bias magnetic field is essential to proper operation of the magnetic sensor by ensuring that the ferromagnetic free layer 116 has a single magnetic domain. In the absence of the longitudinal bias magnetic field, the magnetic moments in the ferromagnetic free layer 116 tend to establish a magnetic multi-domain state. As is known in the art, when the ferromagnetic free layer 116 is allowed to have more than one magnetic domain it experiences Barkhausen jumps and other magnetic domain reorientation phenomena during magnetic reversal when the magnetic sensor is responding to the external magnetic field from the magnetic disk. This situation is highly undesirable since it produces noise and lowers the signal-to-noise ratio of the magnetic sensor and thus the ability to produce the measurable output corresponding to the magnetic bits.

A variety of schemes have been employed to provide the longitudinal bias magnetic field and prevent Barkhausen noise. FIG. 1 illustrates one of the more common approaches, so-called hard bias associated with the hard magnet 118 on either side of the ferromagnetic free layer 116. For more details on hard bias see U.S. Pat. No. 5,729,410.

In the course of manufacturing magnetic sensors, such as that shown in FIG. 1, it is common for the hard magnet 118 that is used to provide the hard bias to taper at the interface with the ferromagnetic free layer 116. As shown in FIG. 1, this taper produces a tip 122 of the hard magnet 118 on either side of the ferromagnetic free layer 116. Regions such as the tip 122 of the hard magnet 118 have negative consequences for the performance and the scaling of the magnetic sensor.

It is known in the art that superior materials for the hard magnet 118 should exhibit high coercivity, high remnant magnetization and the magnetic c-axis should be confined parallel to the film plane (henceforth called in-plane) as opposed to perpendicular to the film plane (henceforth called out-of-plane). These properties strongly depend on the microstructural characteristics of the hard magnet 118, which are in turn sensitive to growth conditions, film thickness and the ancillary non-magnetic layers (so-called seed layers or underlayers) onto which said hard magnet 118 is deposited. Achieving confinement of the magnetic axis in-plane is challenging and difficult in particular for very thin films in which the crystallographic growth is strongly dominated by early stages of nucleation. This situation is encountered at the tip 122 between the hard magnet 118 and the ferromagnetic free layer 116 and is also a general consequence of magnetic scaling, which dictates progressively smaller dimensions including thickness 124 of the hard magnet 118.

Alloys of CoPt and CoPtCr grown on suitable materials offer a partial solution to this hard bias challenge and are widely used as the hard magnet 118. If high temperatures are used during the deposition of the CoPtCr, grains with in-plane c-axis crystallographic orientation can be more easily obtained. Unfortunately, such high temperatures are incompatible with many of the other materials and techniques used to manufacture magnetic sensors and magnetic read heads. As a consequence, some fraction of the magnetic grains in CoPtCr films used to provide hard bias in magnetic sensors have out-of-plane c-axis crystallographic orientation.

These grains with out-of-plane c-axis crystallographic orientation degrade the magnetic sensor performance. The problem is worsened as the dimensions of the magnetic sensor are reduced per the magnetic scaling approach on account of the superparamagnetic effect which results in a loss of the magnetic order when the magnetic grain volume drops below a critical value. In addition, unlike grains in the magnetic disk, which are magnetically decoupled from one another, there is strong exchange coupling between the grains in the hard magnet 118. Furthermore, the average grain size in the hard magnet 118 is not typically scaled as the areal density is increased or, if it is decreased, the scaling ratio is larger than that dictated by the magnetic scaling approach. The combination of these effects increases the negative effect of grains in the hard magnet 118 with out-of-plane c-axis crystallographic orientation. This is especially the case in regions like the tip 122 where the number of grains is reduced as the overall magnetic sensor dimensions are scaled. Even if the average fraction of grains with out-of-plane c-axis crystallographic orientation remains fixed, the tip 122 may have a higher local fraction due to statistical fluctuations. These grains can act as nucleation sites for undesirable magnetic domains in the ferromagnetic free layer 116 with the deleterious effects described above.

One potential solution to this challenge is a seed layer, which improves the crystallographic properties of the hard magnet 118. FIG. 2 shows an illustration of seed layer 126 that helps control the crystallographic orientation of grains in the hard magnet 118. Cubic-titanium tungsten (see U.S. Pat. No. 6,278,595), a bi-layer of tantalum-oxide and Cr (see U.S. Appl. No. 2003/0058586 A1), Cr and alloys of CrMo have been used as the seed layer 126.

Recent advances, however, in the magnetic sensor in magnetic read heads have made a simple seed layer, such as seed layer 126, undesirable. In particular, the so-called ultra contiguous junction (UCJ) arrangement in the magnetic sensor. As shown in FIG. 3, in the UCJ arrangement the hard magnet 118 that provides hard bias is collinear with the ferromagnetic free layer 116 thereby avoiding magnetic instabilities in the magnetic sensor. This, in turn, requires seed layer thickness 128 be increased up to around 15–25 nm. Since the seed layer is polycrystalline, at this thickness stress and crystallographic imperfections will degrade the ability of the seed layer 126 to improve the c-axis crystallographic orientation of the grains in the hard magnet 118. This problem is illustrated in FIG. 4, which shows measured x-ray intensity as a function of diffraction angle (twice the angle of incidence as measured from the normal to the film) at grazing incidence (which is sensitive to grains with out-of-plane c-axis crystallographic orientation) for two samples that are representative of current hard magnet 118 materials used for hard bias in magnetic sensors. The first sample has $CO_3Pt$ hard magnet 118 with thickness 124 of 7.6 nm and a CrMo seed layer 126 with seed layer thickness 128 of 12.0 nm. The x-ray diffraction data 152 for the first sample is shown in FIG. 4. The second sample has 3.0 nm thick Rh cap layer on CoPtCr hard magnet 118 with thickness 124 of approximately 18.0 nm and Cr seed layer 126 with seed layer thickness 128 of 10.0 nm. The x-ray diffraction data 162 for the second sample is also shown in FIG. 4. The presence of peaks corresponding to the $<11\bar{2}0>$ direction in $CO_3Pt$ 170 and CoPtCr 180 are indicative of grains with out-of-plane c-axis crystallographic orientation.

In light of this discussion, there is a need to improve the crystallographic orientation of the grains in the hard magnet 118 that provides the longitudinal bias magnetic field to the ferromagnetic free layer 116 in magnetic sensors. Furthermore, there is a need to provide this improved crystallographic orientation of the grains in the hard magnet 118 with a relatively large thickness 128 seed layer 126, such as is required in magnetic sensors with the UCJ arrangement.

SUMMARY

Improving the crystallographic orientation of the grains in the hard magnet 118 that provides the longitudinal bias magnetic field to the ferromagnetic free layer 116 in magnetic sensors is secured in the present invention by a laminated seed layer structure with at least one interlayer and at least a first underlayer and a second underlayer, where the interlayer is located between the first underlayer and the second underlayer. The seed layer structure accommodates a relatively large total thickness as is required in magnetic sensors with the UCJ arrangement.

In an alternative embodiment of this invention, a second interlayer and a third underlayer are added to the seed layer structure. The second interlayer is located between the second underlayer and the third underlayer.

In another alternative embodiment of this invention, a third interlayer and a fourth underlayer are added to the seed layer structure. The third interlayer is located between the third underlayer and the fourth underlayer.

In yet another embodiment of this invention, a plurality of alternating additional pairs of layers, each pair of layers having an additional interlayer and an additional underlayer, are added to the seed layer structure. The additional interlayer in each pair is located between the underlayer from the previous pair of layers and the additional underlayer in the current pair of layers.

A detailed description of the invention and the preferred and alternative embodiments is presented below in reference to the attached drawing figures.

DETAILED DESCRIPTION OF THE EMBODIMENTS

Figure 5:
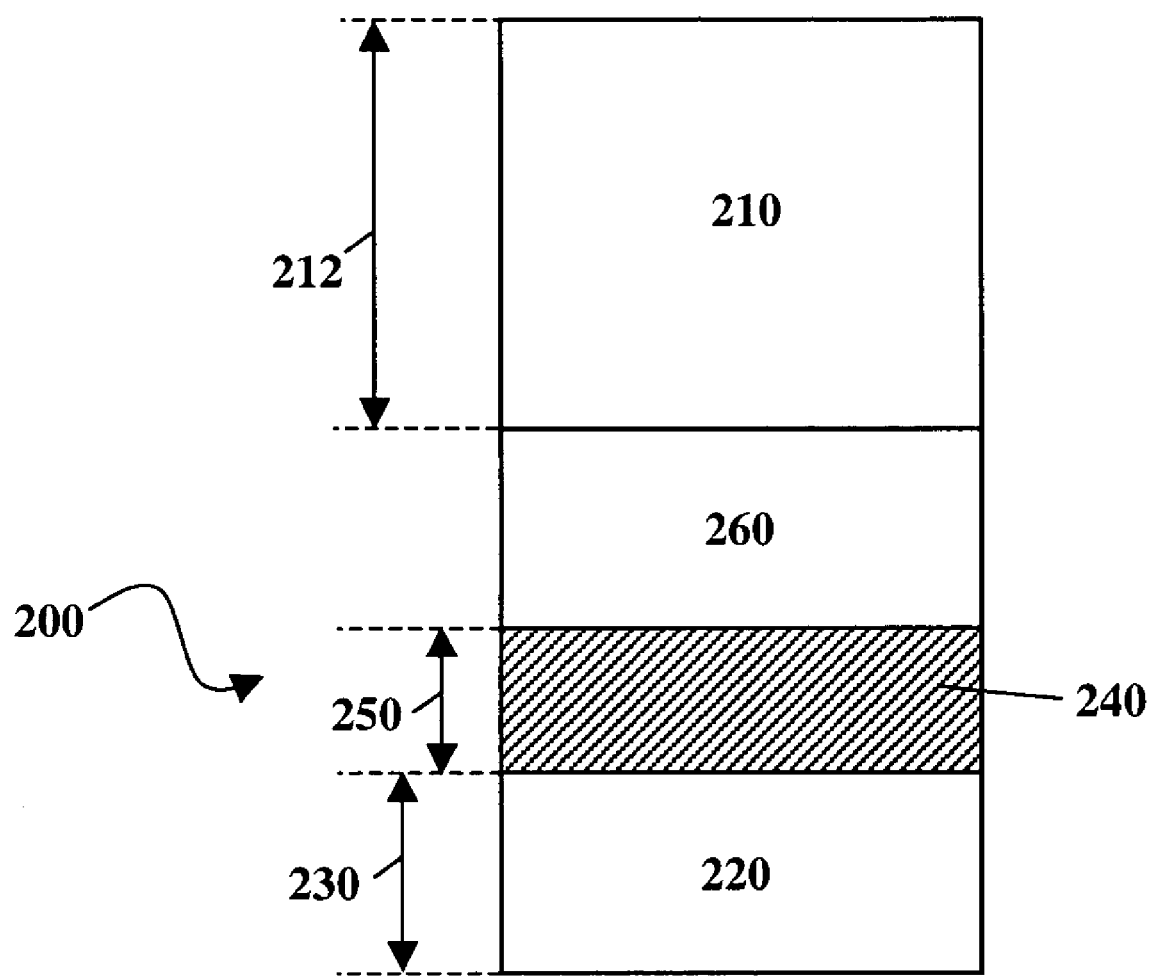
FIG. 5 is a diagram illustrating an embodiment of the invention.
Figure 6:
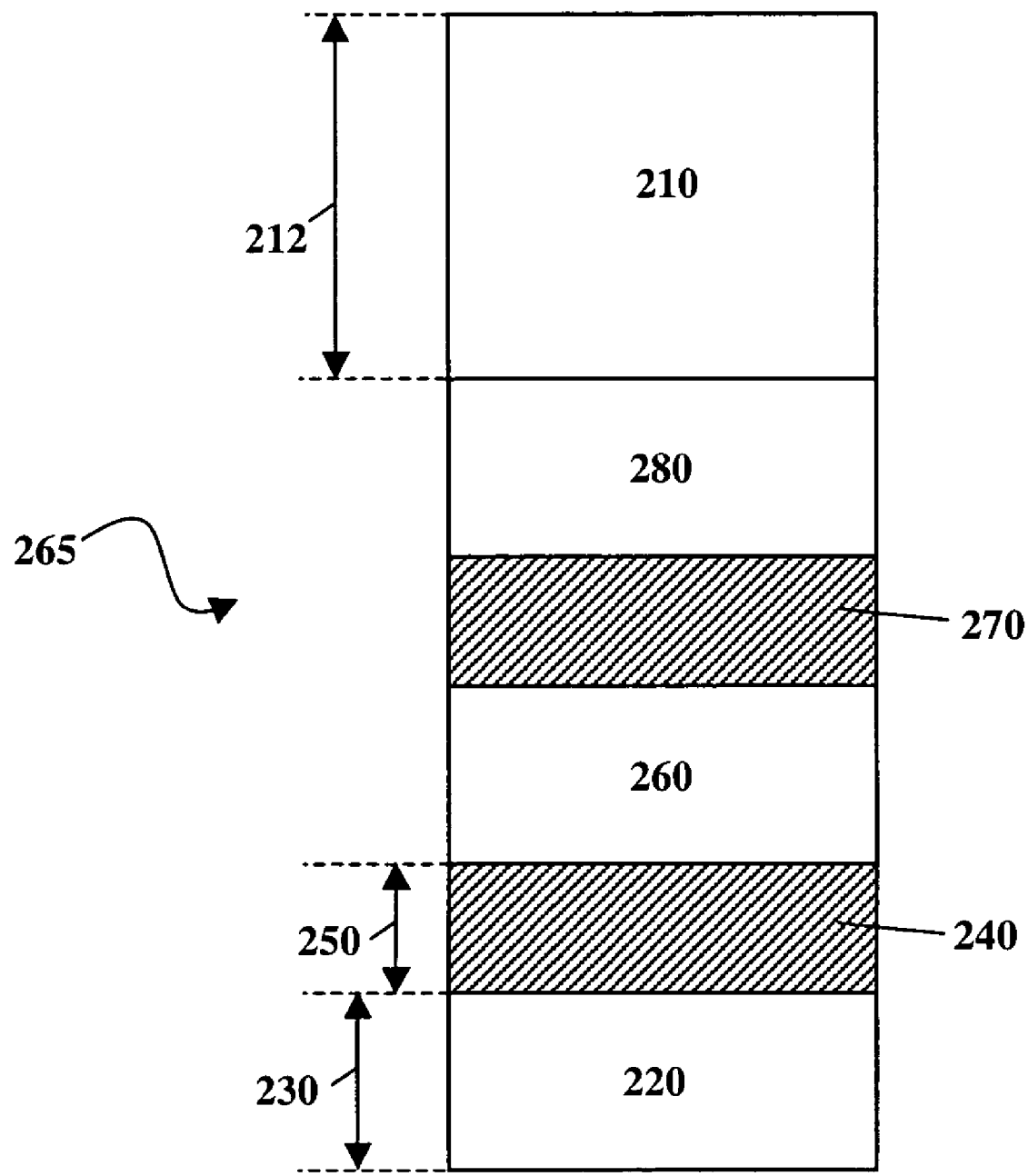
FIG. 6 is a diagram illustrating an embodiment of the invention.
Figure 7:
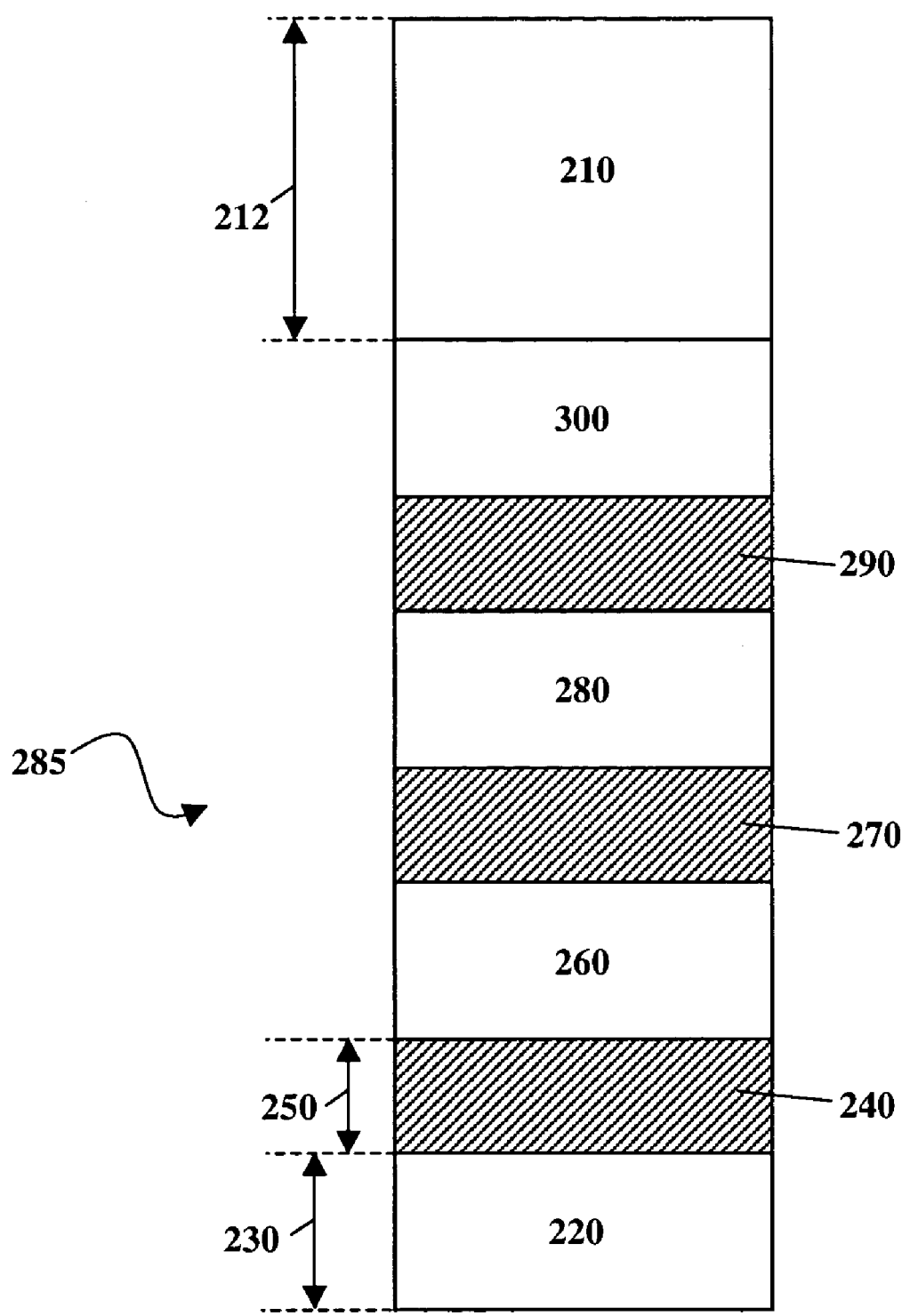
FIG. 7 is a diagram illustrating an embodiment of the invention.

An illustration of an embodiment of the invention is shown in FIG. 5. A hard magnet 210 with thickness 212 is deposited on a seed layer structure 200 comprised of at least a first underlayer 220 with a thickness 230, a second underlayer 260 and a first interlayer 240 with a thickness 250 located between the first underlayer 220 and the second underlayer 260. An illustration of another embodiment of the invention is shown in FIG. 6. An additional third underlayer 280 and second interlayer 270 are added to seed layer structure 265, where the second interlayer 270 is located between the second underlayer 260 and the third underlayer 280. An illustration of another embodiment of the invention is shown in FIG. 7. An addional fourth underlayer 300 and third interlayer 290 are added to seed layer structure 285, where the third interlayer 290 is located between the third underlayer 280 and the fourth underlayer 300. In a final embodiment of the invention (not shown), a plurality of alternating additional pair of layers, each with an interlayer and an underlayer, are added to the seed layer structure 285. The additional interlayer in each pair is located between the underlayer from the previous pair of layers and the additional underlayer in the current pair of layers.

The material for the hard magnet 210 includes alloys of CoPt, such as $Co_yPt_{1-y}$, where $0.25 \leq Y \leq 0.9$, and CoPtCr. Ion beam deposition and sputtering are suitable techniques for depositing the hard magnet 210.

The material for the first underlayer 220 and the second underlayer 260 is typically a metal and includes Cr and alloys of CrMo ($Cr_xMo_{1-x}$, where $0.1 \leq X \leq 0.3$), alloys of CrMn ($Cr_xMn_{1-x}$), alloys of CrTi ($Cr_xTi_{1-x}$) and alloys of CrV ($Cr_xV_{1-x}$). The appropriate alloy is selected in part based on the need to closely match the lattice spacing of the material in the hard magnet 210 and the ability of the alloy to foster growth of the hard magnet 210 with the magnetic axis oriented in-plane. Specifically, body centered cubic (bcc) metals with crystallographic planes <200> growing in-plane and where the lattice mismatch with the hard magnet 210 is in the range 0–3%. An example includes $CrMo_{20}$. Ion beam deposition and sputtering are suitable techniques for depositing the first underlayer 220 and the second underlayer 260.

The material for the first interlayer 240 is typically a dielectric and includes oxides of aluminum, oxides of tantalum, oxides of silicon and oxides of hafnium. Examples include $Al_2O_3$, $Ta_2O_3$, $SiO_2$, HfO and their thin-film, non-stoichiometric equivalents. Ion beam deposition is a suitable technique for depositing the first interlayer 240.

While not shown in FIGS. 5–7, an additional base layer of alumina beneath the first underlayer 220 in the seed layer structure 200 as well as a substrate, such as AlTiC, can be added as is known in the art.

Figure 8:
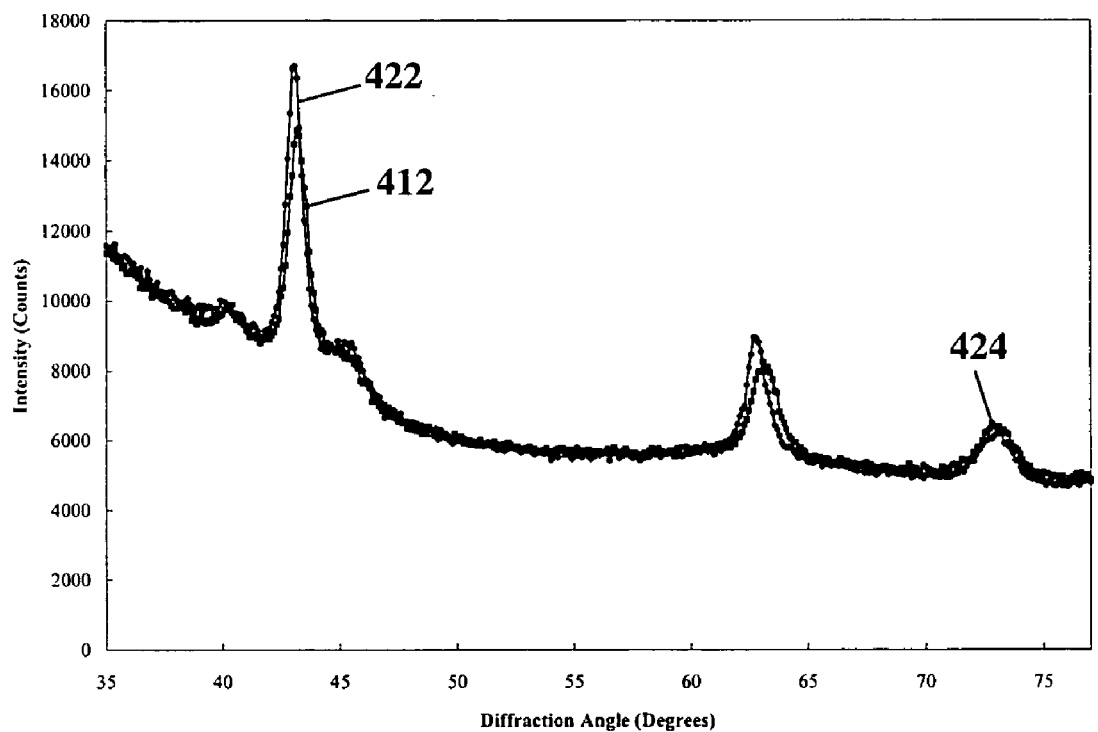
FIG. 8 is a diagram showing the measured x-ray intensity as a function of the diffraction angle at grazing incidence for two samples, each of which is a non-optimal embodiment of the present invention.

Laminated structures with intercalated layers are used in the prior art to break up coherent growth and reduce strain especially in polycrystalline films and when a relatively large total thickness is desired. However, such laminated structures are primarily used to control grain size. In addition, simply forming a laminated structure is insufficient to achieve the benefits of this invention. This is illustrated in FIG. 8, which shows the measured x-ray intensity as a function of the diffraction angle at grazing incidence for two samples, each of which is a non-optimal embodiment of the present invention. A third sample has 2.0 nm thick Ta cap layer on $Co_3Pt$ hard magnet 210 with thickness 212 of 7.6 nm and with seed layer structure 200 comprised of CrMo first underlayer 220 with thickness 230 of 5.0 nm, Cr first interlayer 240 with thickness 250 of 2.0 nm and CrMo second underlayer 260 with a thickness equal to thickness 230. The x-ray diffraction data 412 for the third sample is shown in FIG. 8. A fourth sample has 2.0 nm thick Ta cap layer on $Co_3Pt$ hard magnet 210 with thickness 212 of 7.6 nm and with seed layer structure 265 comprised of CrMo first underlayer 220 with thickness 230 of 3.0 nm, Cr first interlayer 240 with thickness 250 of 1.0 nm and CrMo second underlayer 260 with a thickness equal to thickness 230, Cr second interlayer 270 with a thickness equal to thickness 250 and CrMo third underlayer 280 with thickness equal to thickness 230. The x-ray diffraction data 422 for the fourth sample is shown in FIG. 8. The presence of peak 424 in data 412 and 422 corresponding to the $<11\bar{2}0>$ direction in $Co_3Pt$ are indicative of grains with out-of-plane c-axis crystallographic orientation and the non-optimal nature of the seed layer structure 200 in the third sample and the seed layer structure 265 in the fourth sample.

Figure 9:
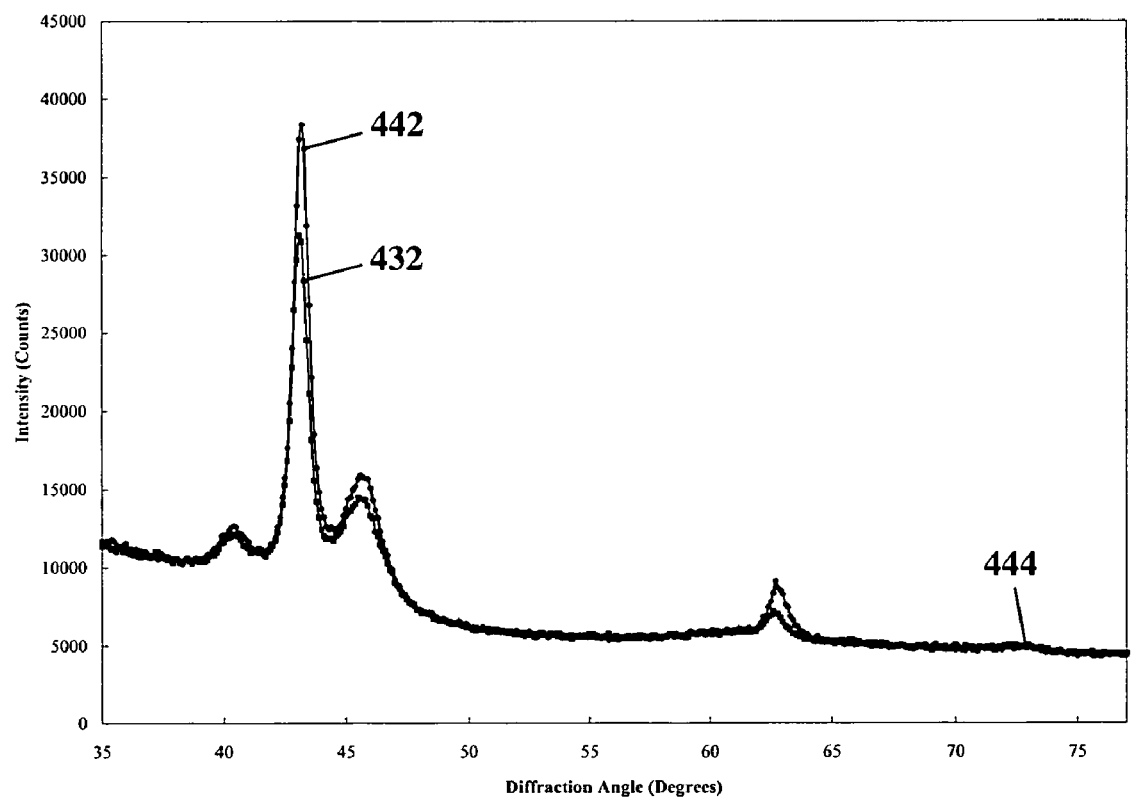
FIG. 9 is a diagram showing the measured x-ray intensity as a function of the diffraction angle at grazing incidence for two samples, each of which is an embodiment of the present invention.

The results presented in FIG. 8 should be contrasted with those in FIG. 9, which shows the measured x-ray intensity as a function of the diffraction angle at grazing incidence for two samples, each of which is an embodiment of the present invention. A fifth sample has 2.0 nm thick Ta cap layer on $Co_3Pt$ hard magnet 210 with thickness 212 of 7.6 nm and with seed layer structure 200 comprised of CrMo first underlayer 220 with thickness 230 of 5.0 mm, $Al_2O_3$ first interlayer 240 with thickness 250 of 1.0 nm and CrMo second underlayer 260 with a thickness equal to thickness 230. The x-ray diffraction data 432 for the fifth sample is shown in FIG. 9. A sixth sample has 2.0 nm thick Ta cap layer on $Co_3Pt$ hard magnet 210 with thickness 212 of 7.6 nm and with seed layer structure 265 comprised of CrMo first underlayer 220 with thickness 230 of 3.0 nm, $Al_2O_3$ first interlayer 240 with thickness 250 of 1.0 nm and CrMo second underlayer 260 with a thickness equal to thickness 230, $Al_2O_3$ second interlayer 270 with a thickness equal to thickness 250 and CrMo third underlayer 280 with thickness equal to thickness 230. The x-ray diffraction data 442 for the sixth sample is shown in FIG. 9. The absence of peak 444 corresponding to the $<11\bar{2}0>$ direction in $Co_3Pt$ are indicative of grains with in-plane c-axis crystallographic orientation and the preferred nature of the seed layer structure 200 in the fifth sample and the seed layer structure 265 in the sixth sample.

Figure 1:
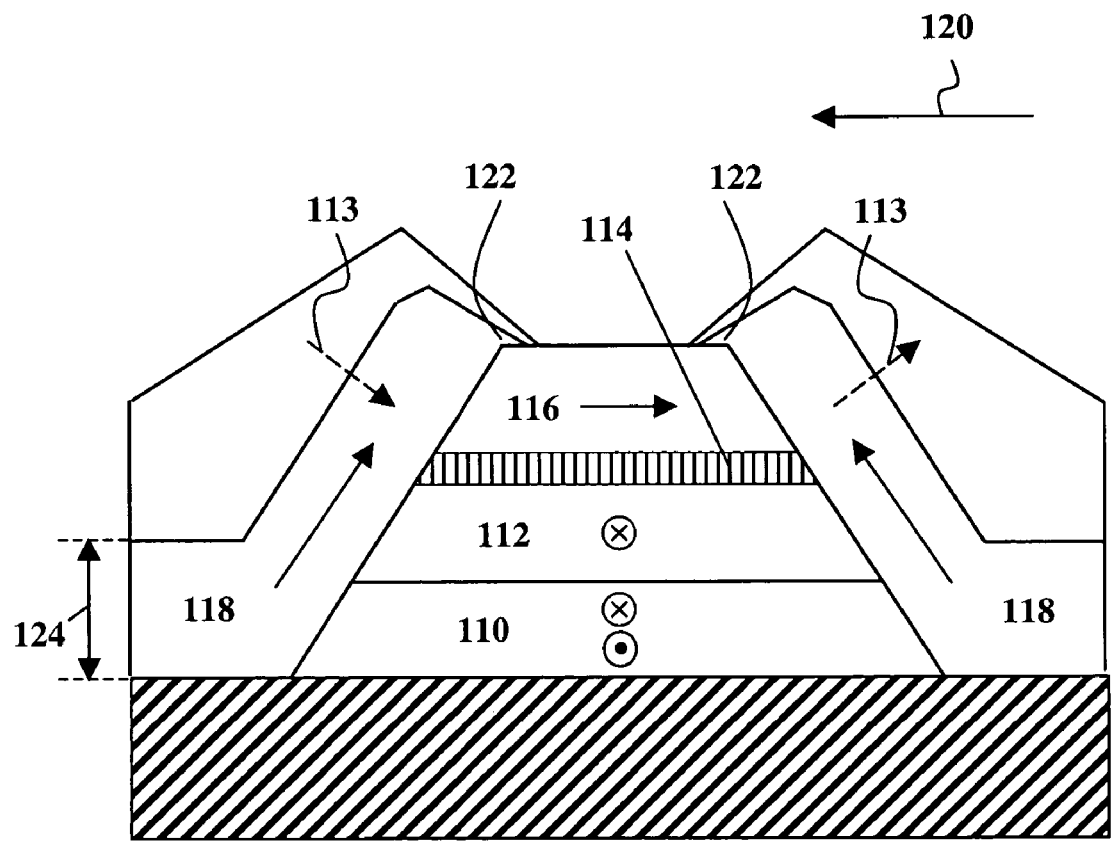
FIG. 1 is a diagram illustrating an airbearing view of a magnetic sensor with hard bias as is known in the prior art.
Figure 2:
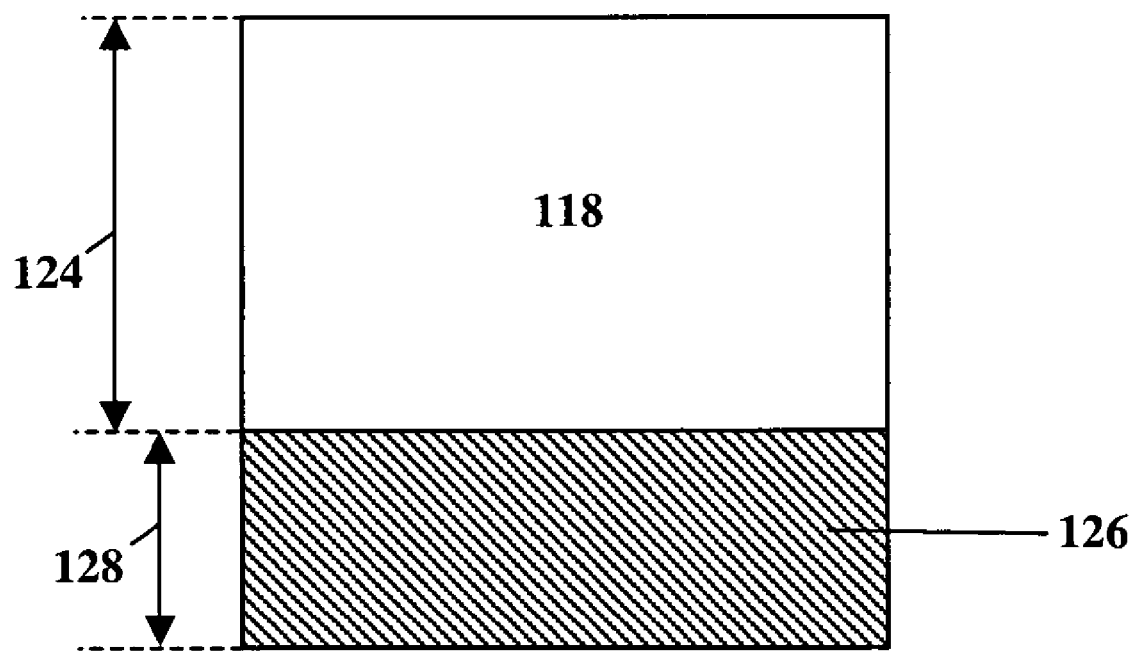
FIG. 2 is a diagram illustrating a hard magnet with a seed layer as is known in the prior art.
Figure 3:
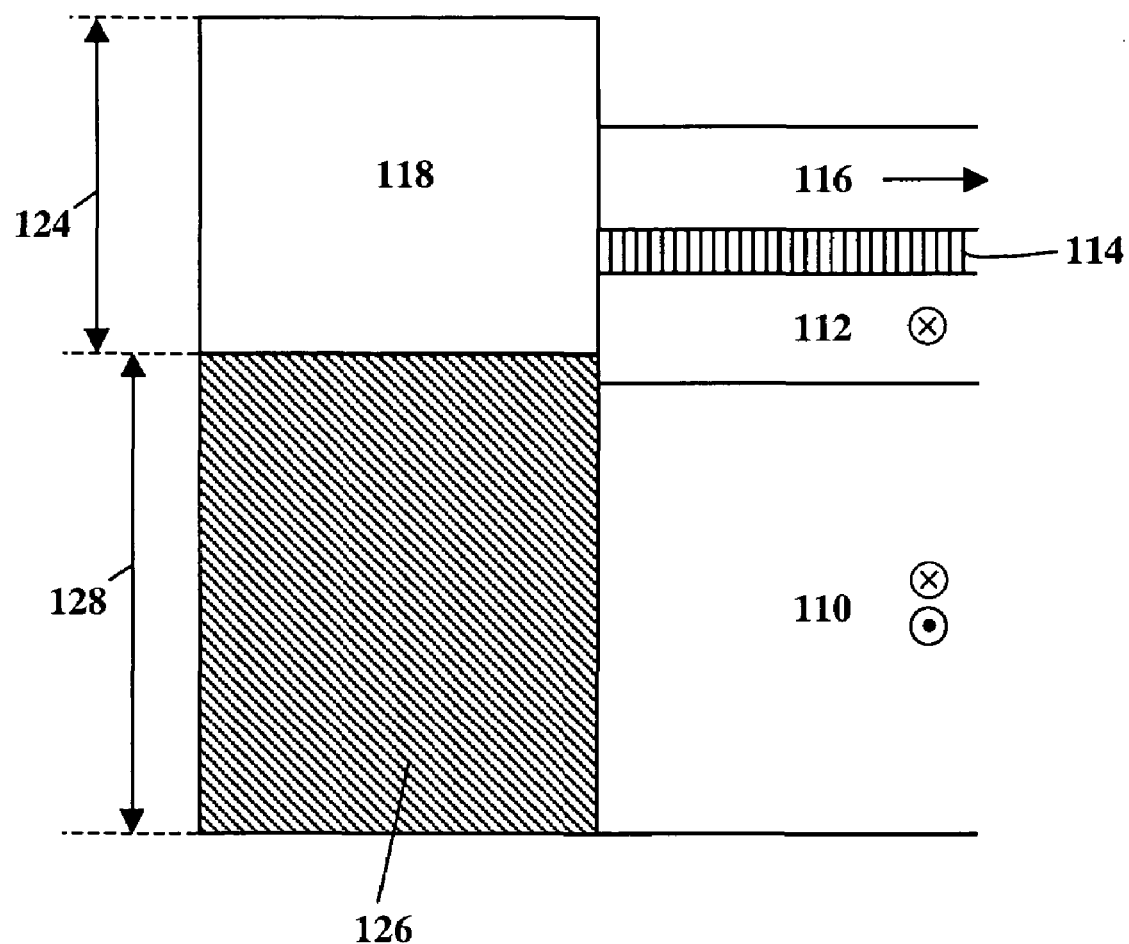
FIG. 3 is a diagram illustrating one side edge of a magnet sensor with the ultra contiguous junction (UCJ) arrangement as disclosed in the prior art.
Figure 4:
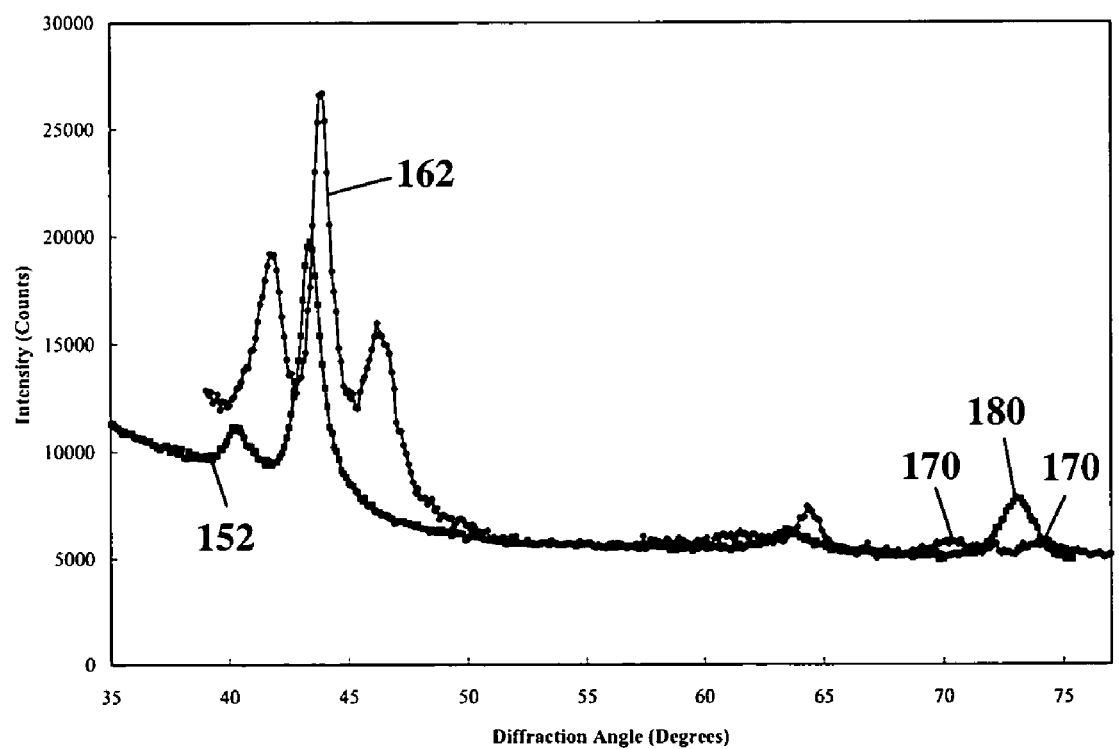
FIG. 4 is a diagram showing the measured x-ray intensity as a function of the diffraction angle at grazing incidence for two samples representative of the prior art.
Figure 10A:
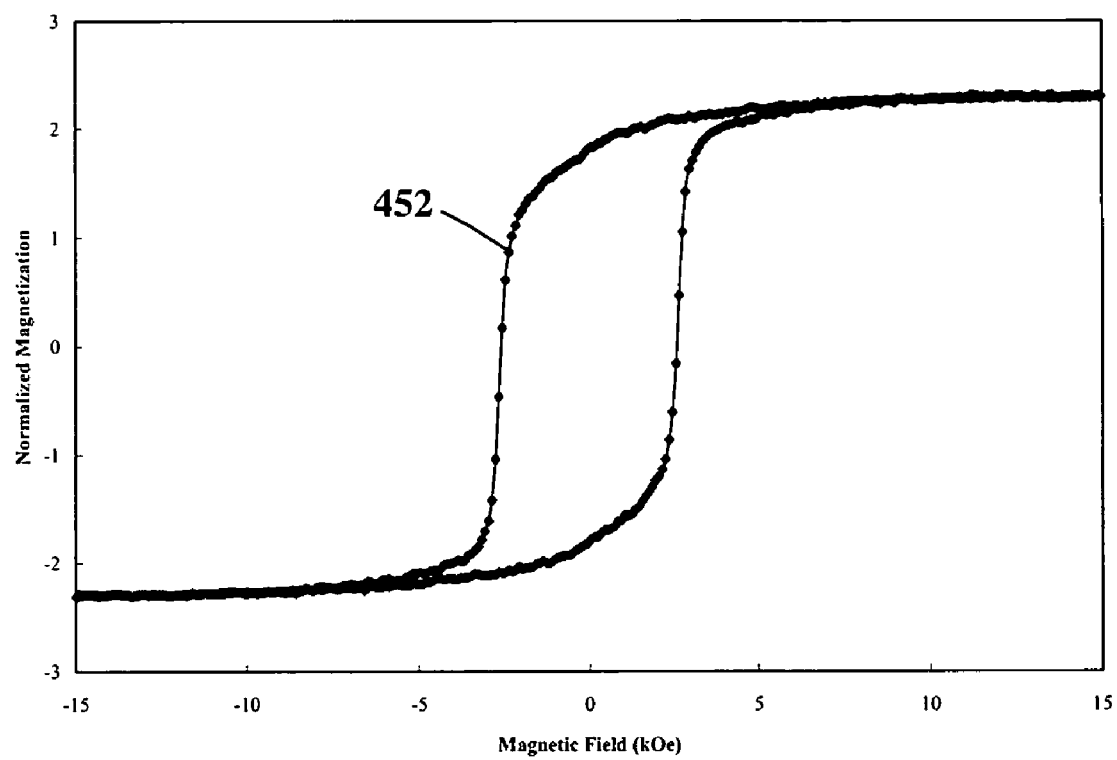
FIG. 10a is a diagram showing an in-plane magnetic hysteresis loop measured in a VSM for a sample representative of the prior art with the magnetic field applied parallel to the plane of the film (in-plane). Both in-plane and out-of-plane magnetization components are detected during acquisition of the hysterisis loop.
Figure 10B:
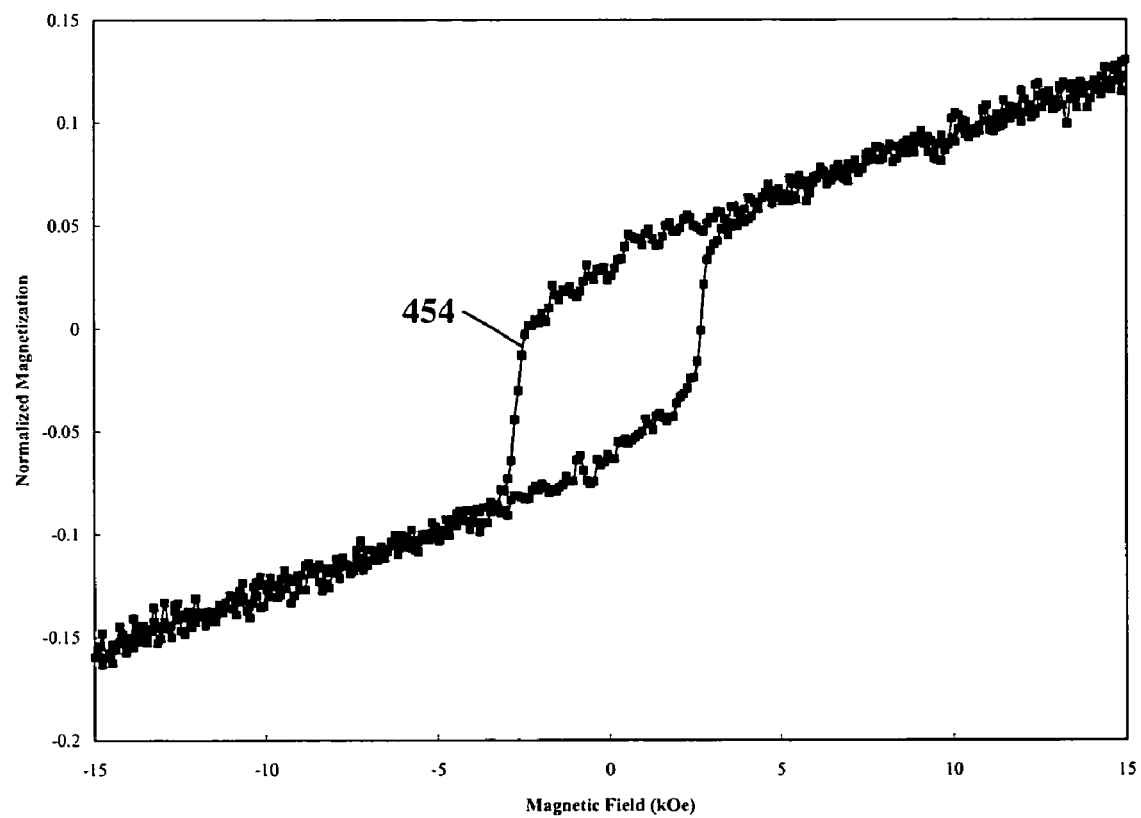
FIG. 10b is a diagram showing an out-of-plane magnetic hysteresis loop measured in a VSM for a sample representative of the prior art with the magnetic field applied parallel to the plane of the film (in-plane). Both in-plane and out-of-plane magnetization components are detected during acquisition of the hysterisis loop.
Figure 10C:
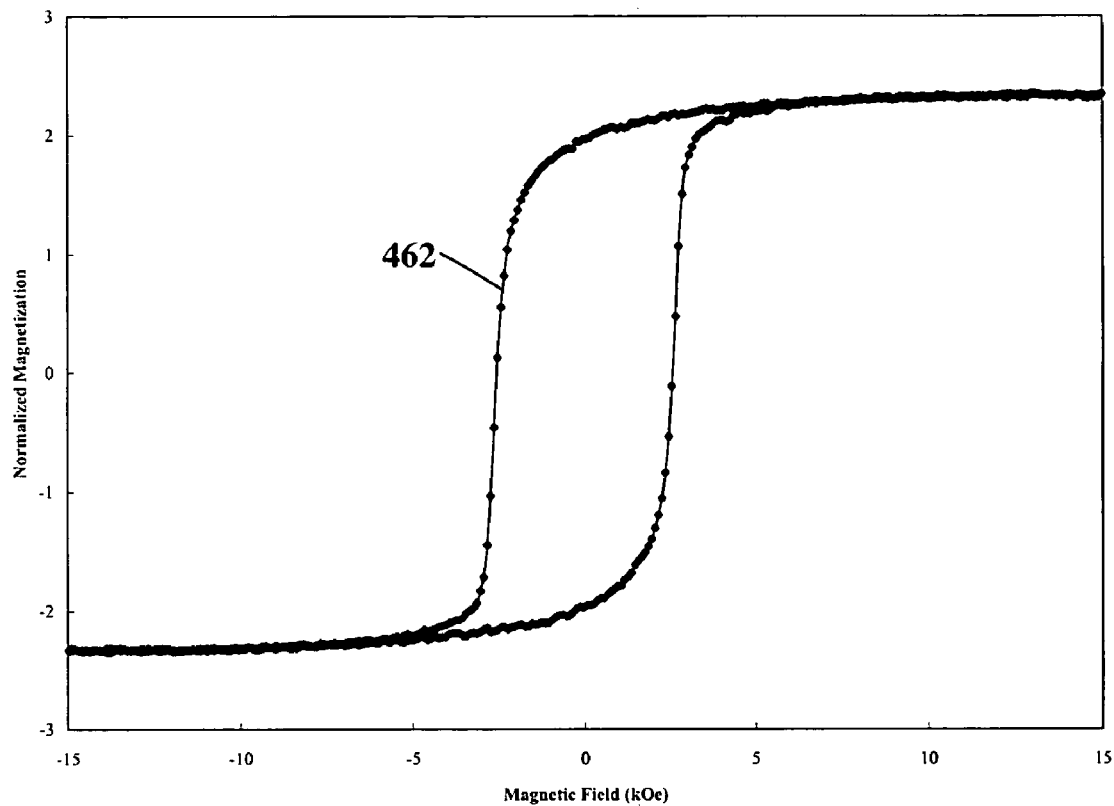
FIG. 10c is a diagram showing an in-plane magnetic hysteresis loop measured in a VSM for a sample representative of an embodiment of this invention with the magnetic field applied parallel to the plane of the film (in-plane). Both in-plane and out-of-plane magnetization components are detected during acquisition of the hysterisis loop.
Figure 10D:
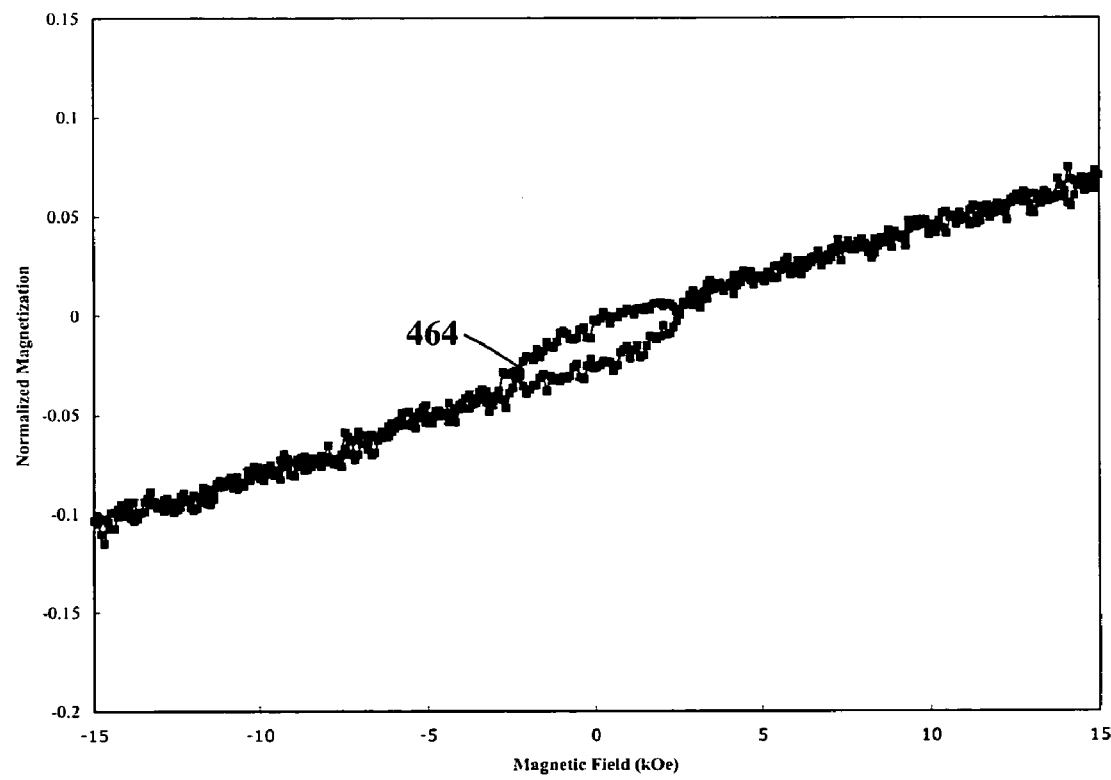
FIG. 10d is a diagram showing an out-of-plane magnetic hysteresis loop measured in a VSM for a sample representative of an embodiment of this invention with the magnetic field applied parallel to the plane of the film (in-plane). Both in-plane and out-of-plane magnetization components are detected during acquisition of the hysterisis loop.

FIGS. 10a–d show magnetic hysteresis loops measured in a VSM for two samples with the magnetic field applied in-plane. The magnetization of the film is monitored with a vector coil arrangement that permits simultaneous detection of the in-plane (FIGS. 10a and 10c) and out-of-plane (FIGS. 10b and 10d) components of magnetization as the applied field is scanned. The in-plane and out-of-plane magnetic properties associated with the preferred and the non-preferred c-axis crystallographic orientation of the grains in hard magnet 210 are thereby measured. The magnetization in FIGS. 10a–d is scaled to that of an equivalent thickness of NiFe. Using the index numbers from FIG. 2, a seventh sample is representative of the prior art, and has 2.0 nm thick Ta cap layer on $Co_3Pt$ hard magnet 118 with a thickness 124 of 7.6 nm and a CrMo seed layer 126 with seed layer thickness 128 of 12.0 nm. The in-plane 452 and out-of-plane 454 magnetic hysteresis loops are shown in FIGS. 10a and 10b. Using the index numbers from FIG. 5, an eighth sample has 2.0 nm thick Ta cap layer on $Co_3Pt$ hard magnet 210 with thickness 212 of 7.6 nm and with seed layer structure 200 comprised of CrMo first underlayer 220 with thickness 230 of 5.0 nm, $Al_2O_3$ first interlayer 240 with thickness 250 of 1.0 nm and CrMo second underlayer 260 with a thickness equal to thickness 230. The in-plane 462 and out-of-plane 464 magnetic hysteresis loops are shown in FIGS. 10c and 10d. In agreement with the x-ray diffraction measurements shown in FIGS. 4 and 9, the seventh sample has an out-of-plane hysteresis loop 454 while the out-of-plane magnetic hysteresis loop 464 of the eighth sample is significantly suppressed. Specifically, the ratio of the in-plane and out-of-plane remnant magnetization for the seventh sample is approximately 80 while the ratio of the in-plane and out-of-plane remnant magnetization for the eighth sample is approximately 1200, an improvement of 15 fold.

Based on these results, it is clear that the seed layer structure 200 in this invention yields unexpected results: certain materials are suitable as the interlayer and not all underlayer and interlayer thicknesses work. For the interrlayer, the thickness 250 range is substantially between 0.1 nm to 10 nm. For example, for $Al_2O_3$ a typical value is 1 nm. The lower bound is set by that necessary to define a continuous film. The upper bound is determined by incoherence in the film. For the underlayer, the thickness 230 is substantially greater than 3 nm. For thickness 230 less than this value, the hard magnet 210 becomes magnetically unstable and the out-of-plane c-axis crystallographic orientation is not suppressed. The total thickness of the seed layer structure 200 is adjustable and can be dictated by the requirements of the UCJ arrangement in the magnetic sensor.

The examples provided in this invention have underlayers with the same underlayer thickness 230 and interlayers with the same interlayer thickness 250. One skilled in the art may incorporate the advantages embodied in this invention in samples having multiple underlayers with different values of the underlayer thickness 230 so long as the underlayer thickness 230 of each underlayer in the seed layer structure 200 is substantially greater than 3 nm. Similarly, one skilled in the art may incorporate the advantages embodied in this invention in samples having multiple interlayers with different values of the interlayer thickness 250 so long as the interlayer thickness 250 of each interlayer in the seed layer structure 200 is substantially between 0.1 nm and 10 nm.

A wide variety of magnetic sensors that have hard bias will benefit from the seed layer structure 200 in this invention including those based on AMR, GMR, top spin valve, bottom spin valve, CIP 113, current perpendicular to the plane (CPP) and magnetic tunnel junction or spin tunneling also known as tunnel valve sensors. For an example of a magnetic tunnel junction sensor see U.S. Pat. No. 6,473,279.

The invention benefits both hard bais structures with a single hard magnet 210 layer as well more complex hard bias structures with synthetic antiferromagnetic bias (for example, see U.S. Pat. No. 6,266,218).

In summary, the seed layer structure 200 in this invention suppresses out-of-plane c-axis crystallographic orientation and accommodates a total thickness that meets the requirements of the UCJ arrangement in the magnetic sensor while preserving the other benefits such as an appropriate epitaxial relationship with the material in the hard magnet 210.

In view of the above, it will be clear to one skilled in the art that the above embodiments may be altered in many ways without departing from the scope of the invention. Accordingly, the scope of the invention should be determined by the following claims and their legal equivalents.

What is claimed is:

1. A seed layer structure for a hard magnetic material for providing longitudinal biasing to a ferromagnetic layer in a magnetic sensor, the seed layer structure being formed on a substrate and comprising:
   a) a first underlayer and a second underlayer located above said first underlayer, each of said first and second underlayers being selected from the group consisting of Cr, $Cr_xMo_{1-x}$, $Cr_xMn_{1-x}$, $CrxTi_{1-x}$ and $Cr_xV_{1-x}$;
   b) a first interlayer located between said first underlayer and said second underlayer, said interlayer being an oxide selected from the group consisting of oxides of aluminum, oxides of tantalum, oxides of silicon and oxides of hafnium; and
   c) a hard magnetic material located above said second underlayer.

2. The seed layer structure in claim 1 further comprising a third underlayer selected from the group consisting of Cr, $Cr_xMo_{1-x}$, $Cr_xMn_{1-x}$, $CrxTi_{1-x}$ and $Cr_xV_{1-x}$ and a second interlayer being an oxide selected from the group consisting of oxides of aluminum, oxides of tantalum, oxides of silicon and oxides of hafnium; said third underlayer and said second interlayer each located above said second underlayer and below said hard magnetic material, wherein said second interlayer is located between said second underlayer and said third underlayer.

3. The seed layer structure in claim 1 further comprising a plurality of alternating underlayers and interlayers each located above said second underlayer and below said hard magnetic material, each of said underlayers selected from the group consisting of Cr, $Cr_xMo_{1-x}$, $Cr_xMn_{1-x}$, $CrxTi_{1-x}$ and $Cr_xV_{1-x}$ and each of said interlayers being an oxide selected from the group consisting of oxides of aluminum, oxides of tantalum, oxides of silicon and oxides of hafnium.

4. The seed layer structure in claim 1 wherein the thickness of said first underlayer and the thickness of said second underlayer are each greater than 3 nm.

5. The seed layer structure in claim 1 wherein the thickness of said first interlayer is between 0.1 nm and 10 nm.

6. The seed layer structure in claim 1 wherein the magnetic sensor is a giant magnetoresistive sensor.

7. The seed layer structure in claim 1 wherein the magnetic sensor is a tunnel valve sensor.

8. The seed layer structure in claim 1 wherein the magnetic sensor is an anisotropic magnetoresistive sensor.

9. The seed layer structure in claim 1 wherein the magnetic sensor is selected from the group consisting of top spin valve sensors, bottom spin valve sensors, giant magnetoresistive sensors, tunnel valve sensors and anisotropic magnetoresistive sensors.

* * * * *